United States Patent [19]

Varshney

[11] 4,275,387
[45] Jun. 23, 1981

[54] CHARGE-COUPLED DEVICE SERIAL ANALOG-TO-DIGITAL CONVERTER AND ASSOCIATED CONVERSION METHOD

[75] Inventor: Ramesh C. Varshney, Sunnyvale, Calif.

[73] Assignee: Fairchild Camera & Instrument Corp., Mountain View, Calif.

[21] Appl. No.: 29,604

[22] Filed: Apr. 13, 1979

Related U.S. Application Data

[62] Division of Ser. No. 868,761, Jan. 12, 1978, abandoned.

[51] Int. Cl.³ .............................................. H03K 13/20
[52] U.S. Cl. .................... 340/347 AD; 307/221 D; 307/227; 328/186; 357/24; 340/347 M; 364/607
[58] Field of Search ................... 340/347 M, 347 AD; 357/23, 24, 41; 328/186, 181; 307/227, 228, 221 C, 221 D; 364/607

[56] References Cited

U.S. PATENT DOCUMENTS

| 3,858,232 | 12/1974 | Boyle et al. ................. 357/23 X |
| 3,930,255 | 12/1975 | Means .......................... 357/24 X |
| 3,983,412 | 9/1976 | Roberts et al. . |
| 3,983,413 | 9/1976 | Gunsagar et al. . |
| 4,003,034 | 1/1977 | Au . |
| 4,041,518 | 8/1977 | Shimizu et al. ............ 357/41 X |

OTHER PUBLICATIONS

Boyle et al., Charge Coupled Semiconductor Devices, BSTJ, Apr. 1976 pp. 586-593.
Mattera, CCDS Edge Toward High-Volume Use, Electronics, 17 Mar. 1977, pp. 74 & 76.
CCD311, 130/260 Bit Analog Shift Register, Preliminary Data Sheet, Sep. 1975, Fairchild, pp. 1-9.
Susskind, Notes on Analog-Digital Conversion Techniques, The Technology Press of MIT and J. Wiley & Sons, pp. 5-2 to 5-7.

*Primary Examiner*—Thomas J. Sloyan
*Attorney, Agent, or Firm*—Paul J. Winters; Ronald J. Meetin; Michael J. Pollock

[57] ABSTRACT

An analog-to-digital converter comprises a pair of charge-coupled device shift registers with a conductive strip along the elements of one of the registers and a resistive strip along corresponding elements of the second register, a comparator responsive to pairs of corresponding charges shifted out of the registers, and a counter responsive to the comparator output signals. An analog signal is applied to the conductive strip to cause the same amount of charge to accumulate in each element of the first register. A reference voltage difference is applied across the resistive strip to cause different amounts of charge to accumulate in the elements of the second register. Each corresponding pair of charges is shifted out of the registers to the comparator which compares the charge magnitudes to produce an output signal indicative of the comparison. The counter then appropriately counts these output signals to produce one or more digital signals.

10 Claims, 5 Drawing Figures

CHARGE-COUPLED DEVICE SERIAL ANALOG-TO-DIGITAL CONVERTER AND ASSOCIATED CONVERSION METHOD

This is a division of application Ser. No. 868,761, filed Jan. 12, 1978, abandoned.

BACKGROUND OF THE INVENTION

1. Field of the Invention

This invention relates to analog-to-digital converters, and in particular to analog-to-digital converters utilizing charge-coupled devices to perform the conversion.

2. Description of the Prior Art

Charge-coupled semiconductor devices were first invented by W. S. Boyle and G. E. Smith. See "Charge-Coupled Semiconductor Devices," *Bell System Technical Journal*, Vol. 49, pp. 587–593, by Boyle and Smith, and U.S. Pat. No. 3,858,232, issued to Boyle and Smith. Since their initial development charge-coupled devices (also referred to as CCD's) have been described in numerous publications. See, e.g., C. H. Sequin and M. F. Tompsett, *Charge-Transfer Devices*, Academic Press, 1975. It is now well known that CCD's may be used to form linear and area imaging sensing devices, digital memories, logic arrays, and various types of signal-processing devices. The application of CCD's to the conversion of analog signals to digital signals, however, is a relatively recent development.

One technique for converting analog signals to digital signals using charge-coupled devices has been developed at General Electric. See *Electronics*, Mar. 17, 1977, at pp. 74 and 76. According to this technique the analog signal is applied to the sense node of a sense amplifier or comparator. While the analog signal is held on the sense node, a fixed amount of charge is repeatedly added to the reference node. As long as the potential of the reference node is less than the sense node, a first signal will be supplied by the comparator. When the reference node reaches the same or a slightly higher potential compared to the sense node, however, a different signal will be emitted by the comparator. The number of times the fixed amount of charge is added to the reference node before the signal changes from the comparator provides a digital value corresponding to the potential of the analog signal.

Unfortunately this technique is undesirably slow in certain instances. For example, if the analog signal is being converted into four digital bits, then up to 16 cycles of addition of the fixed amount of charge will be necessary to generate the digital equivalent to the analog signal. Moreover, because the potential of the reference node is not perfectly proportional to the sum of the charges added to the node over a wide range of potentials, the conversion is not as accurate as desirable.

SUMMARY OF THE INVENTION

Applicant has discovered that analog information may be quickly and accurately converted to digital information by utilizing charge-coupled devices. In one embodiment, referred to herein as parallel conversion, at least one element (or photosite) of each of a first plurality of CCD shift registers is connected to accumulate a packet of charge proportional to a different reference potential generated in a manner hereinafter described. At least one element in each of a second plurality of shift registers is connected to accumulate a packet of charge proportional to the unknown analog signal. The accumulation of charge in a CCD shift register element disposed near a potential source or electrode is well known. See Sequin et al., above, at page 6 et seq. Using a third plurality of comparators or sense amplifiers, each comparator being connected to one of the first and one of the second plurality of shift registers, the amount of charge accumulated by the differing reference potentials may be compared with the amount of charge accumulated by the analog signal. Assuming an appropriate choice of reference potentials, some of the plurality of comparators will detect reference signals which have a greater potential than the analog signal, while the remaining comparators will detect reference signals which have a lower potential than the analog signal. The output signals from the comparators will vary accordingly, and when supplied to an encoder, will cause the encoder to generate a digital signal representative of the analog signal.

In one embodiment of the CCD parallel analog-to-digital converter, the plurality of different reference potentials are generated by applying different potentials to opposite ends of a resistance. This resistance may be formed from polycrystalline silicon which is formed directly over the electrodes used to generate the packets of charge. Because certain elements of each of the first plurality of CCD shift registers are formed beneath different portions of the resistance, different amounts of electrical charge will accumulate in different ones of the first plurality of shift registers. In contrast, the analog signal will be applied to a conductive material beneath which at least one element of each register of the second plurality of shift registers are disposed. Because the analog signal is applied to a conductive material, a substantially equal amount of charge will accumulate in each of the second plurality of shift registers. Then, by transferring the accumulated charges of the shift registers to a third plurality of comparators, each comparator receiving signals from one of the first plurality of shift registers and one of the second plurality of shift registers, each comparator will supply a signal indicating whether the reference signal is greater or less than the analog signal.

In another embodiment of the invention only one comparator is required, and the conversion of the analog signal to digital form is accomplished in a sequential manner. In this embodiment a different reference potential is applied to each photosite or element of a first shift register to thereby accumulate varying amounts of charge in each element. Each element of a second shift register receives a potential corresponding to the potential of the analog signal to thereby accumulate an amount of charge proportional to the potential of the analog signal. The accumulated charges are transferred sequentially, according to well known CCD techniques, to a single comparator which is connected to a binary counter. When the charge packets accumulated in response to the reference potentials are less than the analog signal potential, the comparator will emit a first signal. However, when the reference potential is greater than the analog signal, the comparator will change state and emit a second signal. The binary counter receives the output from the comparator and counts the number of signals of each of the above two conditions. From this information the counter generates a digital signal representative of the analog signal.

The embodiments of this invention provide several advantages over prior art structures as their accuracy is not diminished by any non-linear relationship between charge and potential. Further, the converters of the invention are easily fabricated utilizing conventional CCD processes and may be operated at high speeds.

DESCRIPTION OF THE PREFERRED EMBODIMENTS

Figure 1:
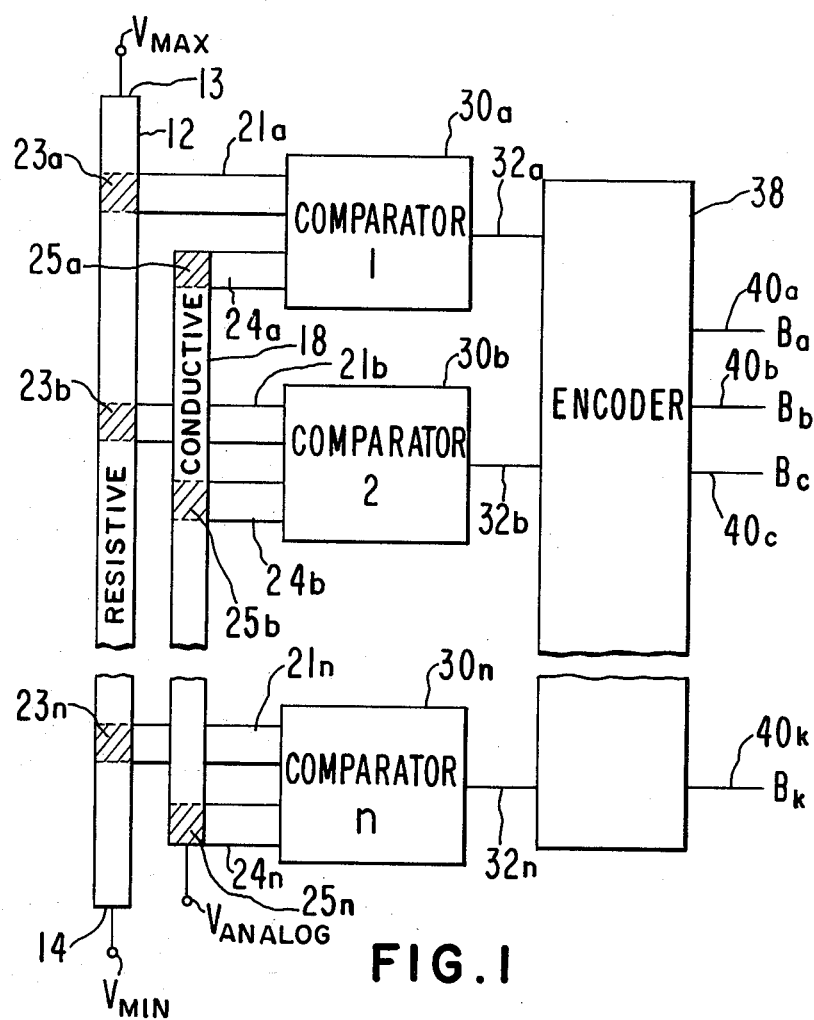
FIG. 1 is a top view of a simplified schematic showing one embodiment of a parallel charge-coupled device analog-to-digital converter.

FIG. 1 is a simplified schematic of a charge-coupled device analog-to-digital converter which operates in parallel. A resistive strip 12 of, for example, polycrystalline silicon, is disposed on the surface of an integrated circuit structure. A voltage is then applied across the strip 12, for example, by applying a voltage $V_{MAX}$ to one end 13 and a voltage $V_{MIN}$ to the opposite end 14. Therefore the electrical potential $V_{REF}$ at any location along resistive strip 12 will depend upon its relative position between ends 13 and 14. Also formed on the surface of the integrated circuit structure is a conductive strip 18 to which an analog signal $V_{ANALOG}$ is applied. Passing beneath resistive strip 12 are a first plurality of CCD shift registers designated 21a, 21b ... 21n. These shift registers may be of any well known design, for example, such as the device of Fairchild Camera and Instrument Corporation (Fairchild) designated by product number CCD311. This device is described in "CCD311, 130/260 Bit Analog Shift Register," Preliminary Data Sheet, September 1975, Fairchild, which is specifically incorporated by reference herein. It is well known in the CCD arts that the potential of resistive strip 12 will cause the accumulation of charge packets 23a, 23b, ... 23n in shift registers 21a, 21b, ... 21n, respectively. In a corresponding fashion the presence of the analog signal on conductive strip 18 will cause the accumulation of packets of charge 25a, 25b, ... 25n in shift registers 24a, 24b, ... 24n, respectively.

According to further well known CCD techniques, the packets of charge which have accumulated in shift registers 21a, 21b, ... 21n and 24a, 24b, ... 24n may be transferred to comparators 30a, 30b, ... 30n, respectively. Comparators 30a, 30b, ... 30n may each be any well known comparator or sense amplifier. Examples of such comparators or sense amplifiers may be found in U.S. Pat. No. 3,983,412 to Roberts et al. U.S. Pat. No. 3,983,413 to Gunsagar et al. and U.S. Pat. No. 4,003,034 to Au, all assigned to the assignee of this application. These three documents are specifically incorporated by reference herein. Each of these sense amplifiers or comparators includes a sense node and a reference node, and emits a first signal if the potential of the reference node is greater than that of the sense node, and an opposite or second signal if the potential of the sense node is greater than the reference node.

Therefore, using comparators 30a, 30b, ... 30n a plurality of signals will be supplied to encoder 38 on lines 32a, 32b, ... 32n, respectively. This plurality of signals will be interpreted by encoder 38 and an appropriate digital output supplied on lines 40a, 40b, 40c, ... 40k. Encoders such as encoder 38 are well known in the art and may comprise, for example, a device which counts the number of "on" signals on lines 32a ... 32n and supplies a corresponding number in binary form.

An example of the operation of the comparators 30a ... 30n and encoder 38 may make their function more readily understood. Assume that the analog signal $V_{ANALOG}$ supplied to conductive strip 18 has a potential between the potential which generates charge packet 23a and the potential which generates charge packet 23b. Therefore, in the first comparator 30a charge packet 23a will be greater than charge packet 25a, and comparator 30a will supply an appropriate signal on line 32a to encoder 38. In all of the remaining comparators, that is comparator 30b ... 30n, the magnitude of charge packets 25b ... 25n will be greater than the magnitude of charge packets 23b ... 23n, respectively and a corresponding output signal will appear on each of lines 32b ... 32n, respectively.

Next, assuming a four-bit digital signal is desired and there are 16 comparators, encoder 38 will receive a first signal on line 32a and a second signal on each of lines 32b through 32n, thereby conveying to it the information that the digital signal is of magnitude 15 of a possible 16. The encoder 38 then converts this information into binary form and accordingly supplies an output signal indicative of a binary one on each of four output lines 40a, 40b, 40c, and 40d.

Figure 2A:
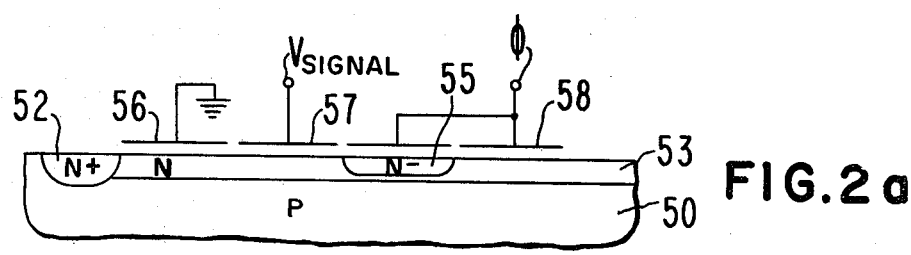
FIG. 2a is a cross-sectional schematic of the structure shown in FIG. 1.

One technique for causing the accumulation of charge packets 23i and 25i in shift registers 21i and 24i respectively, is shown in simplified schematic in FIG. 2a. When used as part of a reference symbol herein, "i" varies from a to n. The structure shown in FIG. 2a includes a P conductivity type substrate 50 into which an N-type region 52 has been diffused or otherwise introduced. An N-type channel region 53 is formed at the surface of substrate 50 and includes one or more barrier regions 55. On the surface of the N channel region 53 and barrier region 55 a series of electrodes are formed. Electrode 56 is grounded. Electrode 57 is connected to receive an electrical signal $V_{SIGNAL}$ which is typically either the analog signal $V_{ANALOG}$ or the reference potential signal $V_{REF}$ at the particular location along resistive strip 12. One or more electrodes 58 receive clock signals, represented as signal $\phi$ to transfer the charges toward the right of the structure shown in FIG. 2a.

Figure 2B:
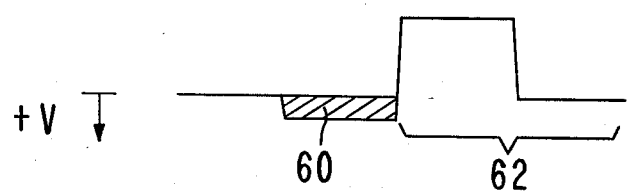
FIGS. 2b and 2c are potential diagrams showing how charge is transferred in a CCD.
Figure 2C:
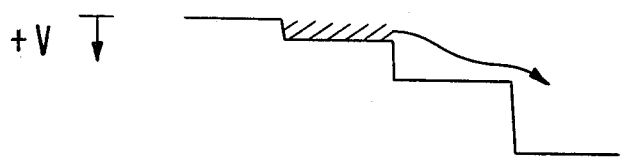

Beneath the structure shown in FIG. 2a is a potential profile diagram designated FIG. 2b. FIG. 2b shows diagrammatically the accumulation of a packet of charge 60 in response to potential $V_{SIGNAL}$ applied to electrode 57. Note that by pulsing signal $\phi$, which is applied to electrode 58, the accumulated charge packet 60 may be transferred to the right. This effect is shown in FIG. 2c. In this manner the accumulated charge packets 23i and 25i, shown in FIG. 1, may be transferred to the right and supplied to the plurality of comparators 30i.

Figure 3:
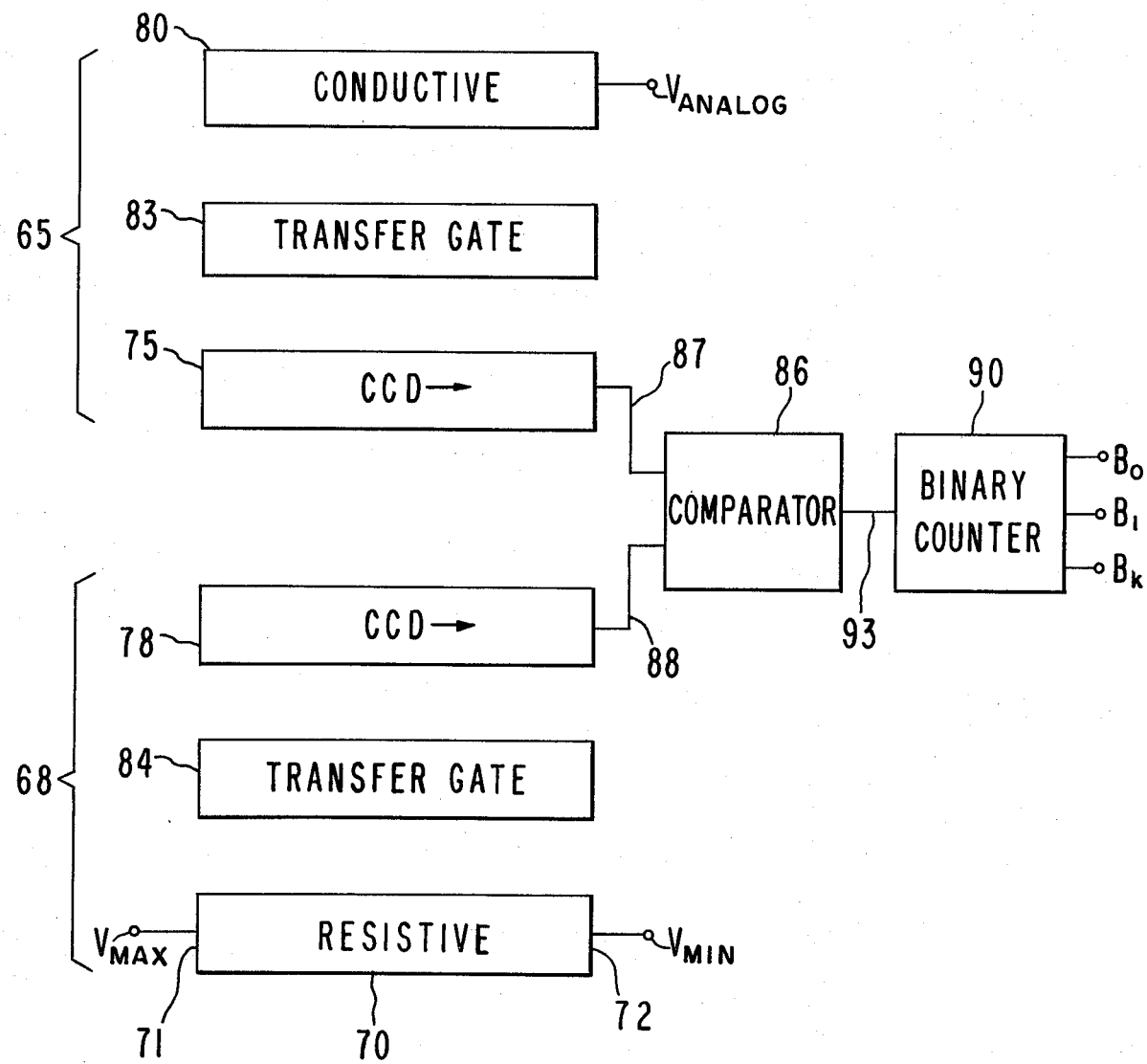
FIG. 3 is a top view of a serial charge-coupled device analog-to-digital converter.

Another embodiment of the CCD analog-to-digital converter of this invention is shown in FIG. 3. In this embodiment only one comparator is required to convert analog information into any desired number of bits of digital information. The converter of FIG. 3 functions in a manner analogous to that previously described in conjunction with FIG. 1, except that the conversion occurs sequentially rather than in parallel. The sequential CCD analog-to-digital converter shown in FIG. 3 is fabricated utilizing only two CCD shift registers 65 and 68. Shift register 68 includes a resistive strip 70 having a desired potential $V_{MAX}$ applied to end 71 and a different and lower potential $V_{MIN}$ applied to its opposite end 72. This establishes a reference voltage difference $\Delta V_{REF}$ (equal to the difference between voltages $V_{MAX}$ and $V_{MIN}$) across the length of the resistive strip 12. Shift register 65, on the other hand, is fabricated utilizing a conductive strip 80 to which the analog signal is applied. Because strip 80 is conductive, the applied potential will be uniform along its entire length. Both CCD shift registers 65 and 68 may be fabricated utilizing conventional well known techniques, for example, as used in the fabrication of Fairchild product CCD311, cited above. Each of the shift registers includes a series of photosites in which charge accumulates (not shown, but disposed beneath strip 70 and strip 80), a transfer gate 83 or 84, and a shift register 75 or 78 to transfer the accumulated charge packets to the comparator 86. As is well known in the CCD art, application of suitable signals to the transfer gates 83 and 84 will cause the charges accumulated in the photosites beneath resistive strip 70 and conductive strip 80, respectively, to be transferred into the corresponding elements of the shift registers 75 and 78, respectively.

Because conductive strip 80 will have a uniform potential throughout its length, an equal amount of charge will be accumulated in each of the photosites beneath it and transferred to register 75. In contrast, resistive strip 70 will cause different amounts of charge to accumulate at different locations beneath it, and therefore, varying amounts of charge will be transferred to the elements of register 78. Upon application of suitable signals to registers 75 and 78 the charges in the various elements of each register will be transferred along connecting wires 87 and 88, respectively, to comparator 86. Comparator 86 is of well known design, for example, according to any of the techniques described by Roberts et al., Gunsagar et al., or Au above. Comparator 86 will supply a first signal to binary counter 90 on line 93 as long as the charges supplied it on line 88 are smaller than the charges supplied on line 87. Of course, the voltages $V_{MIN}$ and $V_{MAX}$ will typically be chosen to encompass a desired range of analog signals to be converted, and therefore, voltage $V_{MIN}$ will typically be smaller than voltage $V_{ANALOG}$. Binary counter 90, also of well known design, will have any desired number of digital outputs $B_0 \ldots B_k$. Binary counter such as counter 90 are well known and commercially available. Binary counter 90 counts the signals supplied on line 93. These signals will remain the same until the relative amounts of charge supplied comparator 86 on line 87 and line 88 change, that is, until the size of the charge packets accumulated in response to the varying potential of strip 70 is greater than the size of the charge packets accumulated in response to signal $V_{ANALOG}$. At this time comparator 86 will change state and cause a different signal to be emitted on line 93. This different signal will stop the operation of counter 90 and cause a digital output signal of the desired number of bits to appear on output lines $B_0 \ldots B_k$.

What is claimed is:

1. A method of converting analog signals to digital signals with a charge-coupled device (CCD) comprising the steps of:
   accumulating at least one first charge packet representative of an analog signal, including applying the analog signal to a conductive region on a CCD;
   accumulating at least two second charge packets representative respectively of a like number of reference voltages, including applying a reference voltage difference across a resistive region on a CCD to generate the reference voltages;
   comparing the first charge packet with each second charge packet to ascertain which charge packet is larger in each comparison;
   generating a binary signal in response to each comparison to indicate which of the first and second charge packets is greater for each comparison; and
   appropriately counting the binary signals to generate at least one digital signal.

2. A method as in claim 1 wherein the step of comparing includes sequentially comparing each first charge packet with a corresponding second charge packet.

3. A method for converting an analog signal to a digital signal comprising the steps of:
   accumulating a first charge representative of the analog signal by applying it to an electrically conductive region of a first charge-coupled device (CCD) shift register;
   accumulating a plurality of second charges representative respectively of a like plurality of reference voltages with a substantially constant voltage increment between each pair of consecutive reference voltages by applying a reference voltage difference across an electrically resistive region of a second CCD shift register;
   sequentially comparing the first charge with each second charge to ascertain which charge has the greater magnitude in each comparison;
   sequentially generating a binary signal of (1) a selected binary type when the magnitude of the first charge exceeds the magnitude of a second charge and (2) the opposite binary type when the magnitude of the second charge exceeds the magnitude of the first charge;
   counting the number of binary signals of at least one of the binary types to obtain the digital signal.

4. A charge-coupled device (CCD) analog-to-digital converter comprising:
   a first CCD shift register comprising a plurality of first CCD charge-storage elements and an electrically conductive strip along the first elements, an analog signal being applied to the conductive strip to cause substantially the same amount of charge to accumulate in each first element, the charges in the first elements being shifted sequentially therealong and out of the first register upon application of appropriate shift control signals;
   a second CCD shift register comprising a like plurality of second CCD charge-storage elements corresponding on a one-to-one basis to the first elements and an electrically resistive strip along the second elements, a reference voltage difference being applied across the length of the resistive strip to create a varying reference potential along the resistive strip and to cause a different amount of charge to accumulate in each second element, the charges in the second elements being shifted sequentially therealong and out of the second register upon application of appropriate shift control signals;
   means responsive to the charges shifted out of the registers for sequentially determining the relationships between each pair of charges originally accumulated in corresponding first and second elements and for sequentially producing output signals indicative of these relationships; and means for translating the output signals into at least one digital signal.

5. A CCD analog-to-digital converter as in claim 4 wherein the charges are shifted out of the registers in pairs which each originally accumulated in corresponding first and second elements.

6. A CCD analog-to-digital converter as in claim 5 wherein the means responsive comprises a comparator which receives the charges shifted out of the registers and determines the relationship between each pair of charges by comparing their magnitudes, the output signals comprising binary signals, each binary signal being indicative of the comparison of the magnitudes of a pair of charges.

7. A CCD analog-to-digital converter as in claim 6 wherein the means for translating comprises a binary counter.

8. A CCD analog-to-digital converter as in claim 4 or 7 wherein the reference voltage difference is established by applying a first reference voltage near one end of the resistive strip and a second reference voltage near the other end of the resistive strip, the voltage of the analog signal being between the reference voltages.

9. A CCD analog-to-digital converter as in claim 5 wherein each element comprises a charge-receiving section and a charge-shifting section, the charge-receiving sections in each register being located particularly along the strip for that register, the charges originally accumulating in the charge-receiving sections, and the charge-shifting sections being located one after another, and wherein each register further includes means for transferring the charges in the charge-receiving sections to the charge-shifting sections, the charges thereafter being shifted along the charge-shifting sections.

10. A CCD analog-to-digital converter as in claim 4, 5, 6, 7 or 9 wherein the resistive strip comprises polycrystalline silicon.

* * * * *